United States Patent [19]
Mehta et al.

[11] Patent Number: 5,644,282
[45] Date of Patent: Jul. 1, 1997

[54] FUSE AND BATTERY APPARATUS UTILIZING SAME

[75] Inventors: Alay M. Mehta, Lawrenceville; Stephanie D. Brown, Atlanta; Michael B. Kirschner, Alpharetta, all of Ga.

[73] Assignee: Motorola, Inc., Schaumburg, Ill.

[21] Appl. No.: 383,633

[22] Filed: Feb. 6, 1995

[51] Int. Cl.[6] .................... H01H 85/04; H01M 14/00
[52] U.S. Cl. .................... 337/295; 337/290; 337/297; 429/7
[58] Field of Search ............... 337/290, 291, 337/292, 293, 294, 295, 296, 297

[56] References Cited

U.S. PATENT DOCUMENTS

| | | | |
|---|---|---|---|
| 4,158,188 | 6/1979 | Howard | 337/290 |
| 4,219,793 | 8/1980 | Kawamura | 337/228 |
| 5,188,909 | 2/1993 | Pedicini | 429/7 |
| 5,204,194 | 4/1993 | Miller et al. | 429/7 |
| 5,227,759 | 7/1993 | Hatagishi | 337/260 |
| 5,309,625 | 5/1994 | Onishi | 29/623 |
| 5,358,798 | 10/1994 | Kleinert, III | 429/7 |
| 5,432,378 | 7/1995 | Whitney | 257/529 |
| 5,453,726 | 9/1995 | Montgomery | 337/290 |
| 5,479,147 | 12/1995 | Montgomery | 337/297 |

*Primary Examiner*—Leo P. Picard
*Assistant Examiner*—Stephen T. Ryan
*Attorney, Agent, or Firm*—Kenneth M. Massaroni

[57] ABSTRACT

A battery pack (10) including at least one battery cell (26) and a circuit carrier (30) in proximity to the battery cell. Disposed in the battery pack, is a fuse (50) which is formed from an electrically conductive resilient material adapted to work as the fuse. The electrically conductive resilient material further is encapsulated with a material adapted to promote resistance to breakage due to shocks, bumping or droppage of battery packs into which the fuse is incorporated. When the temperature of the at least two battery cells reaches a predetermined trip point, the fuse releases from at least one of the batteries, due to the heat transfer from the battery cell, electrically disconnecting the battery cell from adjacent battery cells.

4 Claims, 4 Drawing Sheets

FUSE AND BATTERY APPARATUS UTILIZING SAME

TECHNICAL FIELD

This invention relates in general to battery packs, and more particularly to battery packs having thermal fuses.

BACKGROUND OF THE INVENTION

As consumer products become smaller and more portable, they increasingly rely on battery packs, such as rechargeable battery packs, for power sources. Battery packs used in conjunction with portable electronic devices, (such as two-way portable radios, cellular telephones, and computers, to name but a few), typically include a fuse as part of the battery pack. The fuse, such as a thermal fuse, is used to protect the battery cells inside the battery package from becoming too hot during charge or recharge. Overheating of the cells during charging presents a risk to the battery cells which make up the battery pack. Excessive heating can deleteriously affect battery discharge performance and significantly shorten cycle life of the battery pack. In extreme conditions, rapid overcharging of battery cells in a battery pack can result in a catastrophic failure of the battery pack. Malfunctions resulting in catastrophic failure and/or degraded performance include short circuits between the battery cells or malfunctions attributable to the battery charger.

Known fuses for use in battery packs, however, suffer from a substantial number of practical limitations. Current fuses are typically too large and too heavy to be used in small ultra light consumer applications. As the electronics industry moves to smaller and lighter electronic devices, smaller fuses are required.

Another problem inherent in present day state of the art fuse technology, relates to the fact that such fuses are typically made of materials which are fairly brittle, and hence, are subject to breakage upon shock. As consumer electronic devices become smaller and more portable, such devices are increasingly called upon to withstand more shocks, as by dropping the electronic package including the battery pack from a height of up to six feet or more. Accordingly, fuse devices incorporated into battery packages must be capable of withstanding shocks occasioned by, for example, droppage, bumps and impacts.

Accordingly, a need exists for an improved thermal fuse for use in a battery package. Such improved thermal fuse should overcome the limitations of cost and size, as well as being capable of withstanding shocks and bumps occasioned by typical consumer use.

DETAILED DESCRIPTION OF THE PREFERRED EMBODIMENT

Figure 1:
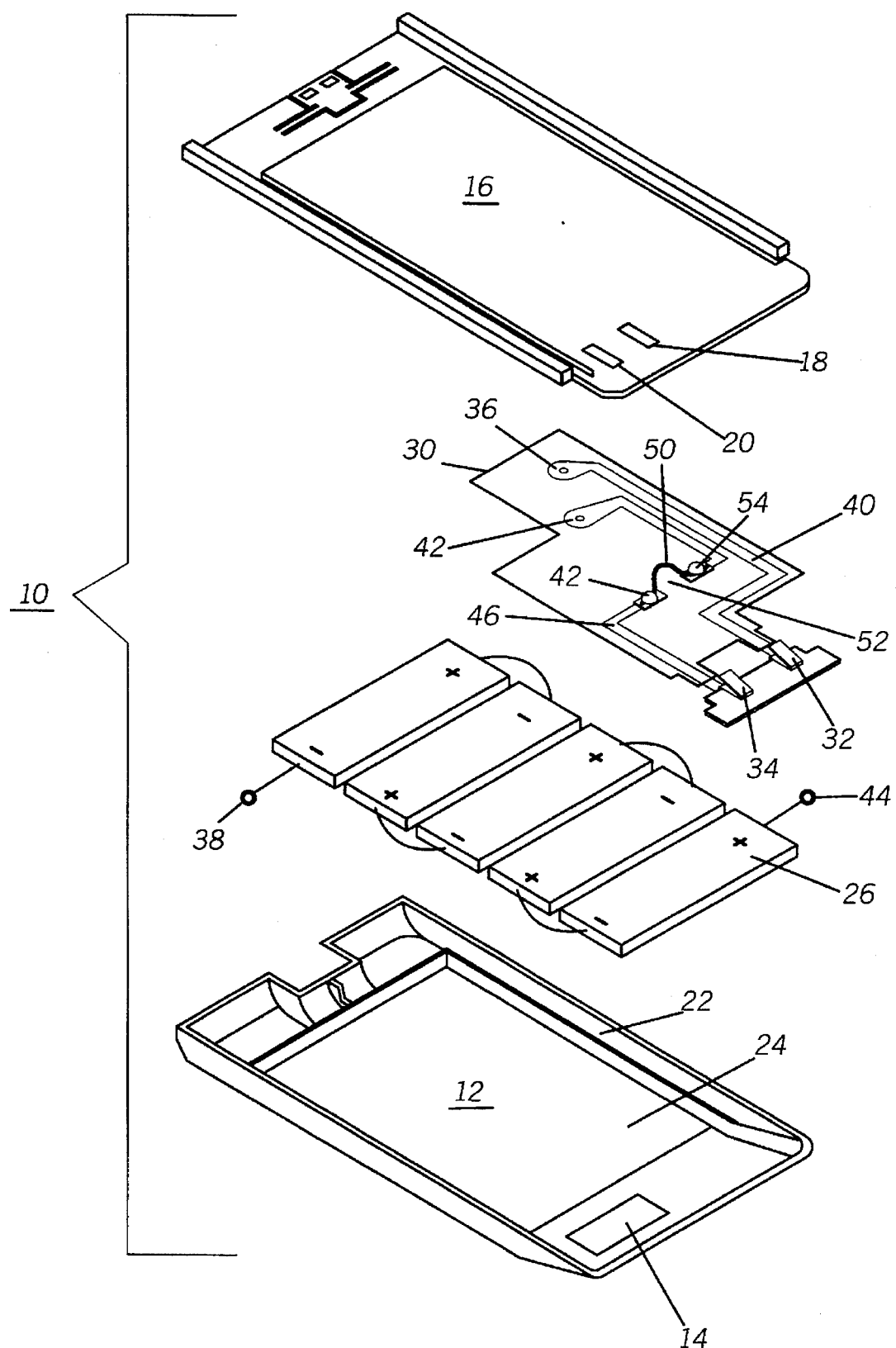
FIG. 1 is an exploded view of a battery assembly in accordance with the instant invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is illustrated an exploded view of a battery pack or assembly (10) in accordance with the instant invention. Battery pack (10) comprises first housing member (12) having an aperture (14) formed therein. The battery pack (10) further includes a second housing member (16) which includes apertures (18 and 20). The first and second housing members (12 and 16) respectively, are mechanically connected to each other in order to form the overall housing for a battery pack (10). The first housing member further includes a sidewall (22) and bottom surface (24). The two housing members may be mechanically connected together using a variety of well known interconnection techniques such as ultrasonic welding, adhesives, and others.

Located between the first and second housing members is at least one, and preferably a plurality of rechargeable battery cells (26). In this example, battery cells are shown as rechargeable prismatic cells having a substantially flat shape; however, cylindrical cells and all other types of battery cells regardless of chemistry, size, or shape may also be used in accordance with the instant invention. Preferably, the plurality of cells (26) are interconnected to each other serially in a fashion well known in the battery art.

Also, located between the two housing members (12 and 16) is a circuit carrier such as a flexible circuit carrier (30) used to electrically couple the serially connected batteries to battery terminals (32 and 34). Circuit carrier (30) lies flush against battery cells (26) when the battery pack (10) is assembled. Flexible circuit carrier (30) may be formed of a number of known materials such as polyimide, mylar, kapton, polyester, and combinations thereof. Preferably circuit carrier (30) is formed from two layers of polyimide, an insulating material, which are bonded together, with current carrying traces located between the two layers. While circuit carrier (30) is preferably described as flexible and conforming in order to be easily placed in the tight confines inside a battery package (10), rigid circuit carriers may also be used depending on the final design of the battery package.

Flexible circuit carrier (30) includes a first metallized area or solder pad (36) for interconnecting the negative battery terminal (38) of the serially connected battery cells. Solder pad (36) is in turn electrically interconnected via a current carrying trace (40) to battery contact (32). A second solder pad (42) is interconnected to battery terminal (44) of the serially interconnected battery cells (26). A current conducting trace (46) located on flexible circuit (30) electrically interconnects solder pad (42) to battery contacts (34). Battery assembly contacts (32 and 34) may be resilient metal fingers which protrude from aperture (18 and 20) located on second housing member (16). Battery assembly contacts (32 and 34) allow for the interconnection of battery pack (10) to an external electronic device such as a radio or other battery operated device. The contacts may also be used to connect the battery pack to a battery charger. Alternately, a second set of contacts (not shown) may be used.

Located on flexible circuit (30) is a fuse (50) connected along trace (42). More particularly, trace (42) has first and second sections separated from one another by an electrically non-conductive region (52). The nonconductive region (52) may simply be a region where trace (42) is broken to form a gap. The first and second portions of trace (42) are connected by fuse (50) which contacts first portion at contact pad (54), and second portion at contact pad (56). As illustrated in FIG. 1, the fuse (50) is disposed between the battery cells (26), and the battery contact (34); it is to be understood, however, that said fuse (50) may also be connected between said battery cells. The fuse (50) will be described in greater detail hereinbelow with respect to FIG. 2–7.

Figure 2:
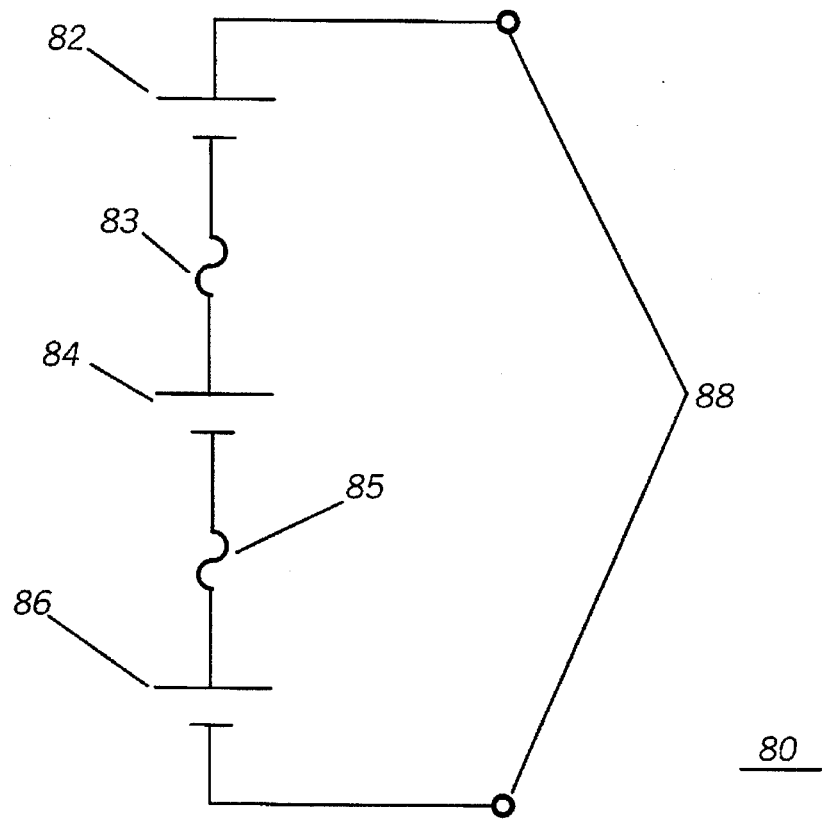
FIG. 2 is a schematic circuit diagram of a battery pack including a fuse in accordance with the instant invention.

Referring now to FIG. 2, and as mentioned hereinabove, the fuse (50) may be disposed either between the battery cell contact (42) and external contact (34), or in-between individual battery cells. Accordingly, FIG. 2 illustrates therein a schematic circuit diagram of a battery pack (80) including a fuse in accordance with the instant invention. Specifically, battery pack (80) shows a plurality of battery cells (82, 84, 86) with fuses (83 and 85) disposed therebetween. More particularly, battery cells (82 and 84) have fuse (83) disposed therebetween; and battery cells (84 and 86) have fuse (85) disposed therebetween. The battery pack (80) further includes battery contacts (88). In the embodiment of FIG. 1, a fuse would be located between a battery cell, for example, (82), and a battery contact (86).

Figure 3:
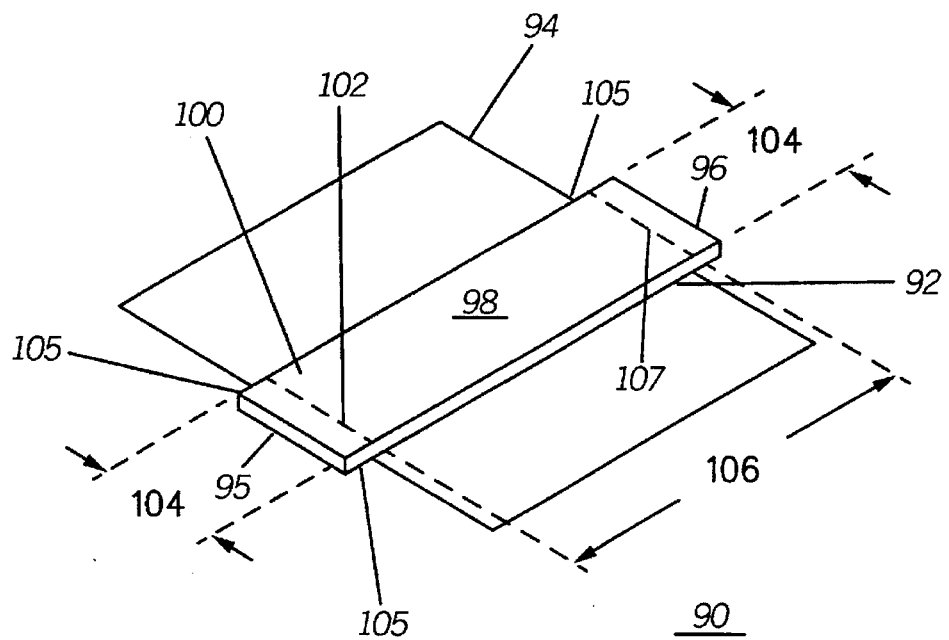
FIG. 3 is a perspective view of a fuse in accordance with the instant invention.

Referring now to FIG. 3, there is illustrated therein a perspective view of a fuse (90) in accordance with the instant invention. The fuse (90) includes a conductive layer (92) and an insulating layer (94). The conductive layer (92) is fabricated of an electrically conductive material, such as copper, tin, lead, nickel, chromium, alloys of any of the foregoing, and combinations thereof. The conductive layer (92) also includes proximal end portion, distal end portion (96), and a strip portion (98) formed therebetween. Conductive layer further includes first and second major surfaces (100 and 102). The end portions (95 & 96) define a width dimension (104) bounded by outer edges (105). The end portions (95 & 96) further define a length dimension (106) bounded by the terminal ends (107) of strip portion (98). The conductive layer (92) forms the fuse link wherein strip portion (98) maybe made of a different electrically conductive material than end portions (95 & 96) so as to allow the fuse link to fuse at selectively different currents. In either event, the end portions and the strip portion may be fabricated from the materials described hereinabove.

The fuse (90) further includes at least one insulating layer (94) which is disposed on at least one of said major surfaces. In an alternative embodiment, and insulating layer may be disposed on both the first and second major surfaces of said conductive layer. The insulating layer (94) is typically a polymeric material such as, for example, polyester, polyimide, mylar, kapton, and combinations thereof. Alternatively, the insulating layer may be fabricated of a paper base material, a resinous coating such as epoxy, and/or a glassy material. In addition to providing electrically insulating properties to the fusible layer of conductive material, the insulating layer (94) is adapted to add rigidity to the fuse (90) particularly when the strip portion (98) has a width dimension narrower than the end portions as is described hereinbelow with respect to FIGS. 4–7. Insulating layer (94) is disposed on at least one of major surfaces (100 or 102) or alternatively may be wrapped around or encapsulate conductive layer (92) such that only a portion of end portions (95 & 96) are exposed for connection to other components. Alternatively, conductive layer (92) when used as a fuse link may have a tape strip disposed on one of said major surfaces, so that the conductive layer may be taped to a circuit board between two contacts prepositioned on the circuit board. The fuse link may then be soldered to the contacts in a fashion well known in the soldering art.

Figure 4:
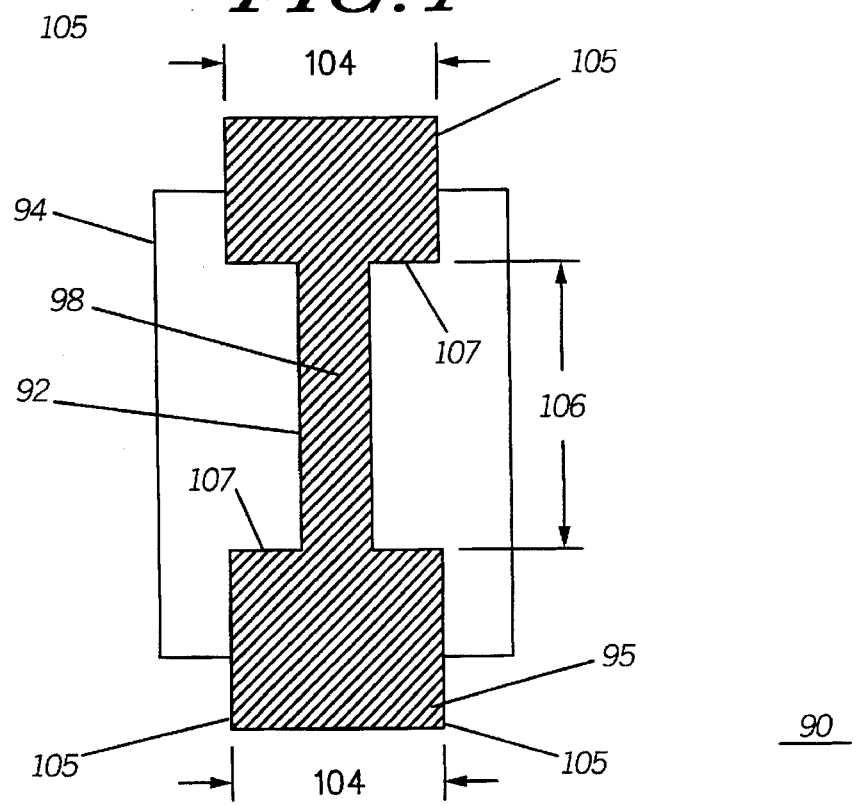
FIG. 4 is a top plan view of a first alternative embodiment of a fuse in accordance with the instant invention.

Referring now to FIG. 4, there is illustrated therein a top plan view of a first alternate embodiment of a fuse in accordance with the instant invention. In the embodiment of FIG. 4, the strip portion (98) of conductive layer (92) is illustrated as narrower than the proximal and distal end portions (95 & 96). As a result of having a narrower strip portion, the strip portion (98) has a smaller cross-sectional area and therefore a higher electrical resistance. When strip portion (98) is so narrowed, insulating layer (94) provides necessary mechanical integrity to keep conductive layer (92) from breaking or cracking due to mechanical forces occasioned by, for example, droppage or other shocks.

Figure 5:
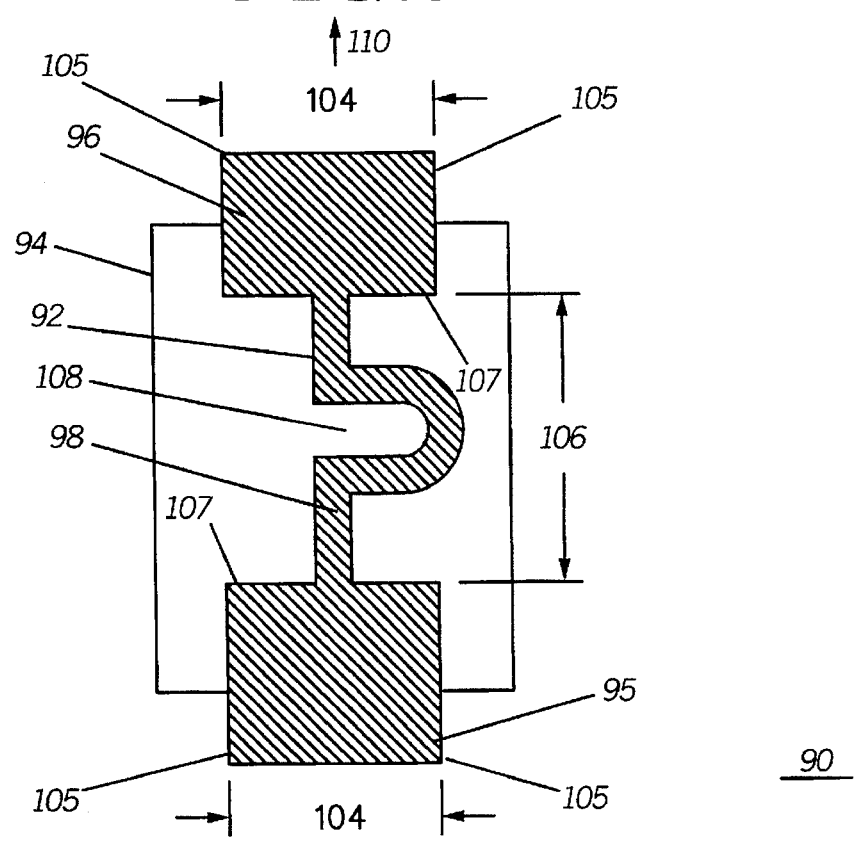
FIG. 5 is a top plan view of a second alternative embodiment of a fuse in accordance with the instant invention.

Referring now to FIG. 5, there is illustrated therein a top plan view of a second alternate embodiment of a fuse in accordance with the instant invention. FIG. 5 illustrates the fuse (90) as in FIG. 4 but further including a U-shaped section. The U-shaped section of strip portion (98) is provided to address two purposes: first, U-shaped portion (108) provides more electrical resistance between end portion (95) and end portion (96); and second, to provide stress relief in the axial direction (110) of fuse (90). As noted above, the conductive material used for strip portion (98) has an intrinsic electrical resistance which is proportional to the path length of the strip portion (98), i.e., the electrical length between end portions (95 and 96). By adding U-shaped section (108), the path length of the strip portion is longer than the length dimension (106), and therefore the resistance between end portions (95 and 96) may be selected so that fuse (90) will fuse at electrically different currents. Further, U-shaped section (108) provides a stress relief to tensional and compressive forces along the fuse axial direction (110) by providing a spring action.

Figure 6:
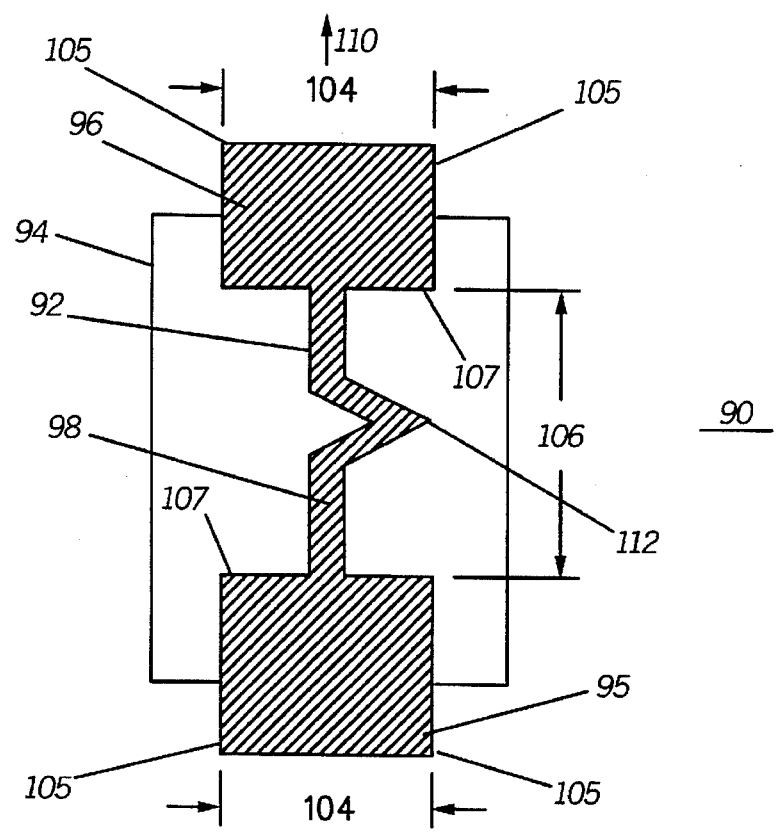
FIG. 6 is a top plan view of a third alternative embodiment of a fuse in accordance with the instant invention.
Figure 7:
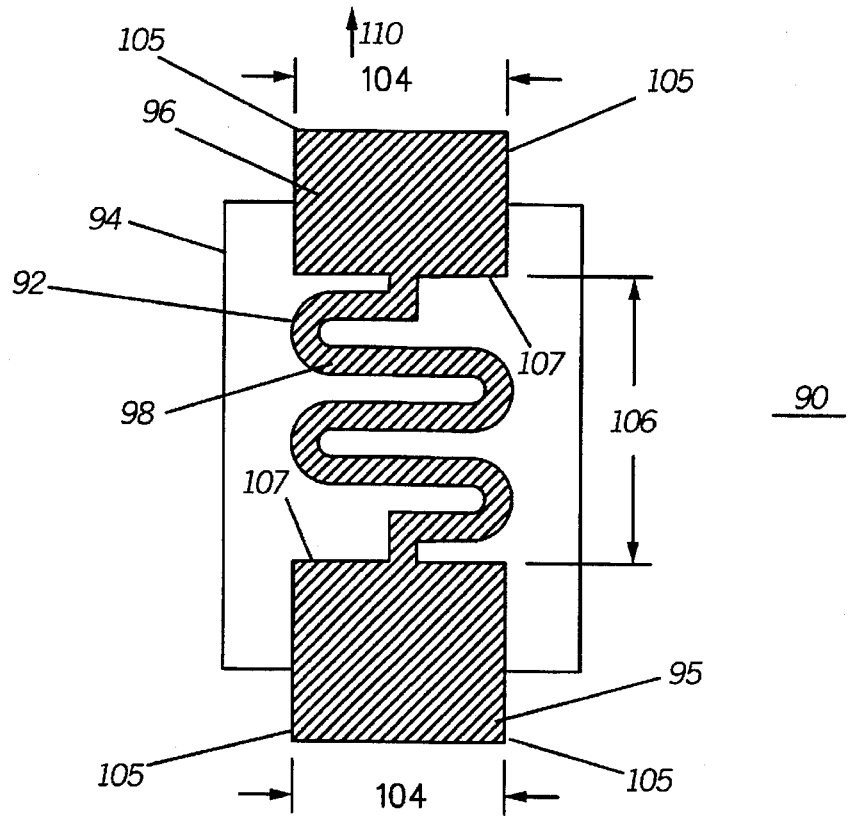
FIG. 7 is a top plan view of a fourth alternative embodiment of a fuse in accordance with the instant invention.

Referring now to FIG. 6, there is illustrated therein a top plan view of a third alternate embodiment of a fuse in accordance with the instant invention. The fuse (90) of FIG. 6 is similar to that of FIG. 5, however, instead of a U-shaped section (108) as in FIG. 5, the embodiment of FIG. 6 illustrates a V-shaped section (112) provided for substantially the same reasons as those given for U-shaped section (108) of FIG. 5. However, depending on the process necessary to make conductive layer (92), a V-shaped section such as section (112) may be easier to implement. FIGS. 5 and 6 show embodiments of strip portion (98) deviating from the axial direction (110). Employing this general concept, FIG. 7 illustrates a fuse wherein strip portion has several deviations from the axial direction (110). Accordingly, although strip portion (98) in FIG. 7 is shown to have a substantially serpentine shape, it may be appreciated that the strip portion may take on any number of other shapes. The primary functions of such deviations is to provide an increase in electrical resistance while maintaining a constant cross sectional area. Further, by providing additional deviations from the axial direction, the fuse (90) is believed to be better able to withstands shocks occasioned by mechanical vibrations, droppage, and other common mechanical shock occurrences.

Since the current at which fuse (90) will fuse depends on both cross sectional area for heat dissipation and electrical resistance for heat generation, the deviations illustrated in strip portion (98) of FIGS. 5, 6 and 7, allow the designer of a circuit to design a fuse current for a particular application. It should also be appreciated that any of the illustrated embodiments may be incorporated into a circuit board, rigid or flexible. Specifically, any of the multiple alternate embodiments shown in FIGS. 4, 5, 6, or 7 may be implemented into the fuse (50) shown in FIG. 1. In such an implementations, strip portion (98) may be formed of the same material used in the rest of the circuit board, or any other material added between two contact pads by means such as are known in the art. When fuse (90) is implemented on a circuit board, the circuit board provides at least one insulating layer (94). Further, since flexible circuit boards often comprise at least two layers of insulating material, it is possible that the fuse (90) be sandwiched between at least two of said layers so that said flexible circuit board provides both first and second insulating layer for conductive layer (92).

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A battery pack comprising:

at least one battery cell; and a thermal fuse member disposed on said at least one battery cell, said thermal fuse member comprising a conductive layer having two end portions and a strip portion formed therebetween, said strip portion defining two major surfaces, each major surface having a layer of a polymeric insulating material disposed thereon, said layer of polymer material being selected from the group consisting of mylar, polyester, polyimide, kapton, and combinations thereof.

2. The battery pack of claim 1, wherein said strip portion comprises a stress relief section.

3. The battery pack of claim 2, wherein said stress relief section comprises at least one U-shaped section.

4. The battery pack of claim 2, wherein said stress relief section comprises at least one V-shaped section.

* * * * *